(12) United States Patent
Murphy et al.

(10) Patent No.: US 8,383,495 B2
(45) Date of Patent: Feb. 26, 2013

(54) SEMICONDUCTOR LAYER STRUCTURE AND METHOD FOR FABRICATING A SEMICONDUCTOR LAYER STRUCTURE

(75) Inventors: Brian Murphy, Pfarrkirchen (DE); Maik Haeberlen, Augsburg (DE); Joerg Lindner, Bobingen (DE); Bernd Stritzker, Kissing (DE)

(73) Assignee: Siltronic AG, Munich (DE)

( * ) Notice: Subject to any disclaimer, the term of this patent is extended or adjusted under 35 U.S.C. 154(b) by 55 days.

(21) Appl. No.: 13/038,479

(22) Filed: Mar. 2, 2011

(65) Prior Publication Data

US 2011/0151650 A1 Jun. 23, 2011

Related U.S. Application Data

(62) Division of application No. 11/702,011, filed on Feb. 2, 2007.

(30) Foreign Application Priority Data

Feb. 2, 2006 (DE) .......................... 10 2006 004 870

(51) Int. Cl.
*H01L 21/20* (2006.01)
*H01L 21/36* (2006.01)
(52) U.S. Cl. ........ 438/481; 438/475; 438/478; 438/495; 257/E21.09; 257/49; 257/77
(58) Field of Classification Search ............. 257/E21.09, 257/E21.561, 49, 77, 110, 148; 438/480, 438/481, 475, 479, 478, 492, 495, 502, 509, 438/788, 789
See application file for complete search history.

(56) References Cited

U.S. PATENT DOCUMENTS

| | | | | |
|---|---|---|---|---|
| 6,083,324 A | * | 7/2000 | Henley et al. | ................ 148/33.2 |
| 6,273,950 B1 | * | 8/2001 | Kitabatake | ...................... 117/95 |
| 6,562,703 B1 | * | 5/2003 | Maa et al. | ..................... 438/518 |
| 7,910,415 B2 | * | 3/2011 | Mishima | ....................... 438/164 |
| 2005/0191828 A1 | | 9/2005 | Al-Bayati et al. | |

(Continued)

FOREIGN PATENT DOCUMENTS

DE 10318283 A1 11/2004
EP 1437764 A1 7/2004

(Continued)

OTHER PUBLICATIONS

N.H. Zhang et al., The Effect of the AlxGa1-xN/AlN Buffer Layer on the Properties of GaN/Si (111) Film Grown by NH3-MBE, Journal of Crystal Growth 2008 (2005), p. 346-351.

(Continued)

*Primary Examiner* — Chris Chu
(74) *Attorney, Agent, or Firm* — Leydig, Voit & Mayer, Ltd.

(57) ABSTRACT

Semiconductor layer structure and a method for producing a structure are provided, including a substrate made of semiconductor material, on which a layer made of a second semiconductor material is situated, furthermore a region (3) enriched with impurity atoms, which region is situated either in layer (2) or at a specific depth below the interface between layer (2) and substrate (1), additionally a layer (4) within the region (3) enriched with impurity atoms, which layer comprises cavities produced by ion implantation, furthermore at least one epitaxial layer (6) applied to layer (2) and also a defect region (5) comprising dislocations and stacking faults within the layer (4) comprising cavities, the at least one epitaxial layer (6) being largely crack-free, and a residual strain of the at least one epitaxial layer (6) being less than or equal to 1 GPa.

12 Claims, 2 Drawing Sheets

U.S. PATENT DOCUMENTS

| | | |
|---|---|---|
| 2006/0166475 A1 | 7/2006 | Mantl |
| 2006/0211221 A1* | 9/2006 | Mantl et al. .................. 438/475 |
| 2006/0220127 A1 | 10/2006 | Mantl |
| 2009/0104762 A1* | 4/2009 | Kusumoto et al. ............ 438/530 |
| 2009/0134460 A1* | 5/2009 | Adam et al. .................. 257/347 |
| 2009/0321747 A1* | 12/2009 | Murphy et al. ................ 257/77 |

FOREIGN PATENT DOCUMENTS

| | | |
|---|---|---|
| GB | 2211991 A | 7/1989 |
| JP | 2000349267 A | 12/2000 |
| JP | 2005203666 A | 7/2005 |
| KR | 2003-74152 | 9/2003 |
| WO | WO 2004/047150 A2 | 6/2004 |
| WO | WO 2004/082001 A1 | 9/2004 |
| WO | WO 2004/095552 | 11/2004 |

OTHER PUBLICATIONS

Hobart et al., Compliant Substrates: A Comparative Study of the Relaxation Mechanisms of Stained Films Bonded to High and Low Viscosity Oxides, Journal of Electronic Materials, vol. 29, No. 7 (2000), p. 897-900.

Donnelly et al., The Effects of Radiation Damage and Impurities on Void Dynamics in Silicon, Nuclear Instruments and Methods in Physics Research B 175-177 (2001), p. 132-139.

* cited by examiner

SEMICONDUCTOR LAYER STRUCTURE AND METHOD FOR FABRICATING A SEMICONDUCTOR LAYER STRUCTURE

RELATED APPLICATIONS

The present application is a divisional application of U.S. patent Ser. No. 11/702,011, filed Feb. 2, 2007, which claims the benefit of German Patent Application Serial No. 10 2006 004870.9, filed on Feb. 2, 2006, the complete disclosure of which is hereby incorporated by reference herein in its entirety and for all purposes.

FIELD OF THE DISCLOSURE

This disclosure relates to a semiconductor layer structure and to a method for fabricating a semiconductor layer structure.

BACKGROUND OF THE DISCLOSURE

For producing modern components for high-power electronics and also optoelectronics, the prior art usually uses substrates which can only be fabricated in a very complicated and hence high-cost manner. Furthermore, such substrates often have a high defect density.

An alternative for producing cost-effective and high-quality substrates consists in depositing a thin layer (a few tens of nm) of the desired substrate material on a high-quality and cost-effective substrate, for example, on a silicon wafer. This yields lattice-matched substrates which enable a low-defect epitaxial deposition of further layers.

However, in this method, the substrate determines significant physical properties, in particular the coefficient of thermal expansion. This is problematic because, by way of example, the growth of III-V compound semiconductors such as GaN by means of metal organic chemical vapor deposition (MOCVD) is often effected at comparatively high temperatures of above 1000° C. in order to ensure a sufficient quality for component fabrication. If a layer deposited at such high temperatures is cooled on a substrate having a significantly lower coefficient of thermal expansion, then first a tensile stream of the deposited layer occurs and subsequently the layer often cracks, which renders it unusable.

As proposed in Journal of Crystal Growth 280, 346-351 (2005), N. H. Zhang et al., interlayers of differing composition and/or structure may be used during the deposition, which are intended to compensate for the strains that arise.

One obvious disadvantage is the complicated process implementation, since, in general, different process steps and parameters are necessary for the production of the interlayers as compared to the deposition of the desired layer. In principle, so-called "compliant substrates" or matched substrates constitute another possibility. These are understood to be substrates in which a thin layer of the desired substrate material is applied to another substrate in such a way that there is only a weak mechanical coupling between the substrate and the applied layer.

A method of this type is described for example in Journal of Electronic Materials 29(7), 897-900 (2000), Hobart et al. In this case, first an $Si_{1-x}Ge_x$ layer is deposited on an SOI ("silicon-on-insulator") wafer, then the buried silicon dioxide layer is doped with boron and phosphorus. This borophosphosilicate layer has the property of being able to flow viscously starting from temperatures of approximately 800° C., which enables a stress relaxation of any layers deposited thereon.

The problem manifested in this case, however, is that deposited layers bulge out on these substrates. The reason for this is due to the high viscosity of the borophosphosilicate layer and the necessity of thermal contraction of the deposited layer when cooling to room temperature. Since the fabrication of modern semiconductor components places high demands on the planarity of the layers, this is a serious disadvantage. Such bulging out has hitherto been possible to be achieved in such material systems only—as described in the above publication—by a patterning of the substrates, which is undesirable in many cases.

Further disadvantages arise from the complexity of the fabrication of such substrates. Use is usually made of SOI ("silicon-on-insulator") wafers based on technologically complex processes such as the "smart-cut" process or high-dose oxygen ion implantation ("SIMOX" method).

Other methods for fabricating such virtual substrates, as described for example in EP 1437764 A1 and WO2004/082001 A1, deliberately fabricate a defect region in the substrate in order to enable relaxed layers on non-lattice-matched substrates, in particular for the purpose of producing strained silicon layers on relaxed $Si_{1-x}Ge_x$ layers which were grown on silicon.

An ion implantation step is employed here which serves to produce a defect region below the layer already deposited beforehand or a deposited layer system. During a subsequent thermal after-treatment, the defect region leads to the formation of dislocations and stacking faults in the original substrate, which have a relaxing effect on the deposited layer or the layer system. A prerequisite for these methods is thin low-defect layers on the silicon substrate which can relax by means of a thermal after-treatment after the ion implantation step.

The problem in this case, however, is that the defect regions produced remain stable only over short times and anneal with a longer process duration.

This is associated with the fact that Ostwald ripening takes place. That is to say that the cavities coarsen their size distribution by vacancy diffusion and combine to form a small number of larger cavities. As a result, the density of the cavities produced becomes so low that, for energetic reasons, dislocations or stacking faults no longer form between the cavities. This problem occurs in the case of long process times at high temperatures, for example, during the deposition of a layer by means of MOCVD on the layer structure. Since relaxation of the layer structure during cooling is no longer possible on account of the excessively low density of cavities, the deposited layer cracks.

Possibly increasing the cavity density solves this problem only to a limited extent since, starting from a critical density of the cavities, it is possible for the deposited layer to split off—particularly during subsequent high-temperature processes at temperatures greater than or equal to 1000° C.

Therefore, an aspect of the present disclosure is to provide substrates for stress- and crack-free deposition of semiconductor materials and also a method for fabricating substrates of this type.

This aspect of the disclosure involves a method for fabricating a semiconductor layer structure, comprising the following steps: a) provision of a substrate made of a semiconductor material; b) application of a layer made of a second semiconductor material to the substrate for the purpose of producing a semiconductor layer structure; c) implantation of light gas ions into the semiconductor layer structure for the purpose of producing a layer comprising cavities in the semiconductor layer structure; d) stabilization of the cavities by impurity atoms of a specific species; e) application of at least one epitaxial layer to the semiconductor layer structure.

The substrate provided in a) is preferably a wafer made of monocrystalline silicon.

Furthermore, the use of semiconductor wafers fabricated by means of bonding methods is also preferred.

The use of an SOI ("silicon-on-insulator") wafer as a substrate is likewise preferred.

However, the substrate may also comprise polycrystalline semiconductor material.

The substrate may furthermore also be layer structures comprising a silicon layer, a silicon-germanium (SiGe) layer or a germanium layer.

Generally, all substrates on which monocrystalline or polycrystalline layers can be deposited are suitable.

The layer made of a second semiconductor material that is to be applied in step b) is preferably a monocrystalline silicon carbide layer.

However, a silicon-germanium layer or a layer structure comprising a silicon-germanium layer is also preferred as the layer to be applied in step b).

The application of the layer made of a second semiconductor material for the purpose of producing a semiconductor layer structure in step b) of the method according to this disclosure is preferably effected by means of chemical vapor deposition (CVD), molecular beam epitaxy (MBE) or by ion beam synthesis (IBS).

Depending on the method used for applying the layer in step b), preferred layer thicknesses are 0.5 nm to 100 µm in the case of CVD, 0.5 nm to 5 µm in the case of MBE and 0.5 nm to 1 µm in the case of IBS.

The layer thickness of the layer applied in b) is particularly preferably 1-500 nm, independently of the method used.

In step c) of the method according to this disclosure, light gas ions are implanted into the semiconductor layer structure.

The implantation of the gas ions may be effected in a depth range below an interface between the applied layer and the substrate or else within the layer applied in b).

Here an implantation energy is chosen in the first case such that the cavities arise just below an interface between the substrate and applied layer, that is to say preferably within the range of 0-500 nm below that interface.

By means of the implantation of light gas ions, cavities or bubbles are produced in the semiconductor layer structure.

The implanted gas ions are preferably hydrogen ions.

Implantation of noble gas ions of one or more atom types selected from a group of helium ion, neon ions and argon ions is also preferred.

The implantation of noble gas ions may also be an implantation of mixtures of the atom types or else a combination of separate implantations of the atom types.

By way of example, it is possible, therefore, to combine a helium ion implantation with a neon ion implantation.

On the other hand, a combination of an implantation of hydrogen ions and an implantation of noble gas ions of one or more atom types selected from a group of helium ions, neon ions and argon ions is also preferred.

By way of example it is possible, therefore, to combine an implantation of hydrogen ions with an implantation of helium ions.

For example, for a 70 nm thick SiC layer on a silicon substrate, an implantation energy of 22 keV for helium ions and a dose of approximately $2 \times 10^{16}$ cm$^{-2}$ may be chosen. This then leads to a defect region of approximately 0-70 nm below the interface between the applied layer and the substrate.

Lower implantation energies can be chosen in order to produce the defect region within the applied layer.

The implantation energies, depending on the thickness and type of the deposited layer, preferably lie within the range of 1 keV-2 MeV.

The implantation energies particularly preferably lie within the range of 10-200 keV.

In particular, implantation energies of 20-50 keV are especially to be preferred.

The point in time at which the cavities arise can be controlled by way of the choice of the implantation temperature:

If low implantation temperatures and high doses are chosen, cavities having a certain size are already produced directly after the implantation.

It is believed to be preferable, however, to choose higher implantation temperatures of approximately 400° C. The foremost aspect of such a temperature is to produce only seeds for cavities, which, after suitable stabilization thereof by impurity atoms, even during subsequent long, high-temperature processes at temperatures of 900-1250° C. and with treatment durations of 2 hours or longer, result in a narrow cavity distribution with average cavity diameters of approximately 10 nm.

In particular, it is possible to prevent the layer from splitting off later in a high-temperature process up to a temperature of 1250° C.

The choice of the doses of the hydrogen or noble gas ions to be implanted is dependent on the type and thickness of the applied layer and also on the implantation energy.

The doses of the hydrogen and/or noble gas ions to be implanted preferably lie within the range of $1 \times 10^{13}$ to $1 \times 10^{17}$ cm$^{-2}$.

Doses within the range of $1 \times 10^{15}$ cm$^{-2}$ to $5 \times 10^{16}$ cm$^{-2}$ are particularly preferred.

It will be understood by the person skilled in the art that the resulting concentrations of impurity atoms are dependent on the implanted dose and on the thermal out-diffusion. The required doses are therefore preferably determined experimentally.

A tilting of the semiconductor layer structure relative to the ion beam during the implantation is likewise preferred.

The semiconductor layer structure is preferably tilted by an angle of 0-60° with respect to the ion beam.

Angles of 0-30° are particularly to be preferred, angles of 0-15° being especially preferred.

In step d) of the method according to the disclosure, the cavities in the semiconductor layer structure are stabilized by impurity atoms of one or more atom types selected from a group of oxygen, nitrogen and carbon.

This is effected, in the case where impurity atoms of those atom types are already present in the substrate and/or in the applied layer, at least in the region of the layer comprising cavities, preferably by means of a thermal treatment of the semiconductor layer structure conducted at a temperature of 600° C. or greater.

In this case, the impurity atoms may be present in dissolved form, in the form of compounds with the substrate material, or as precipitates.

A separate thermal treatment is not necessary, however, nor is it preferred if the application of the at least one epitaxial layer in accordance with step e) is effected at a temperature of at least 600° C.

Sufficient densities of areal defects such as are required for a relaxation of the deposited layer are not achieved below said temperature.

A thermal treatment of the semiconductor layer structure at very high temperatures of 1300° C. or higher is possible, in principle. However, the dynamic behavior of Ostwald ripening must be taken into consideration here, which may lead to undesirable effects at such temperatures, even in the case of impurity-atom-stabilized cavities. It is primarily desirable to prevent the applied layer from chipping off, and also an excessively large decrease in the density of the cavities on account of coarsening. Therefore, the thermal treatment of the semiconductor layer structure and the deposition of epitaxial layers on the semiconductor layer structure are preferably effected at temperatures of 600-1250° C.

If impurity atoms of one or more atom types, which are preferably selected from a group of nitrogen, oxygen and carbon, are not present in sufficient concentration in the substrate or at least in the region of the cavities produced, an implantation of ions of said atom types into the semiconductor layer structure is preferably effected in step d).

In this case, the implantation is preferably chosen such that the concentration maximum of the impurity atoms and the concentration maximum of the implanted gas ions coincide or at least lie in a similar depth range.

Therefore, implantation energies of 10-200 keV are preferably chosen.

Finally, in accordance with step e) at least one epitaxial layer is applied to the semiconductor layer structure.

At least one epitaxial layer is preferably a layer made of monocrystalline silicon.

The at least one epitaxial layer preferably comprises a nitride compound semiconductor.

The at least one epitaxial layer preferably comprises semiconductor material having a significantly different, namely higher, coefficient of thermal expansion in comparison with the semiconductor material of the substrate.

By way of example, all the compound semiconductors have a substantially different, namely a greater, coefficient of thermal expansion in comparison with silicon, cf. Table 1.

The deposited layers are typically II-IV and III-V compound semiconductors. In particular, they are layers composed of: $Al_xGa_{1-x}N$, $Al_xGa_yIn_{1-x-y}N$, $Al_xGa_yIn_{1-x-y}P$, $Al_xGa_{1-x}Sb$, $Al_xGa_yIn_{1-x-y}N_aSb_{1-a}$, $Al_xGa_yIn_{1-x-y}N_aP_bSb_{1-a-b}$, GaAs, ZnO, CdTe, CdS, CdSe and $CdS_xSe_{1-x}$.

In particular, layer stacks as a combination of the above compound semiconductors are also conceivable and preferred.

TABLE 1

Coefficients of thermal expansion for selected semiconductor materials

| Material | Coeff. of lin. thermal expansion | Coeff. of lin. thermal expansion | Coeff. of lin. thermal expansion |
|---|---|---|---|
| Si | 2.6 | | |
| GaN | | 5.59 | 3.17 |
| 3C—SiC | 3.8 | | |
| 6H—SiC | | 4.3 | 4.7 |
| ZnO | | 6.51 | 3.02 |
| AlN | | 4.15 | 5.27 |

In this case, these layers may, of course, be doped with impurity atoms of any desired type according to their intended application.

Depending on the desired orientation or crystal structure (100)-, (110)-, (111)- or else misoriented semiconductor wafers may be used in the case where silicon is used as substrate.

If the semiconductor layer structure is a silicon carbide layer on a silicon wafer, the deposition of nitride compound semiconductors and thus the fabrication of starting materials for applications in optoelectronics are preferred.

In this case, the silicon carbide layer is preferably between 1 nm and 500 nm thick.

The layer thickness particularly preferably lies within the range of 30 nm to 150 nm, layer thicknesses of between 50 nm and 100 nm being especially preferred.

The thickness of the deposited nitride layer preferably lies—according to the later application—within the range of 100 nm to 100 µm, layer thicknesses within the range of 200 nm to 20 µm being particularly preferred and layers having thickness of between 500 nm and 5 µm being especially preferred.

If a layer structure made of GaN/AlN on a silicon carbide layer on silicon is involved, then it is possible to achieve threading dislocation densities of less than or equal to $10^{10}$ $cm^{-2}$, preferably within the range of $10^6$ to $10^{10}$ $cm^{-2}$.

Another aspect of the disclosure involves a semiconductor layer structure, comprising a substrate made of semiconductor material, on which a layer made of a second semiconductor material is situated. Furthermore a region enriched with impurity atoms is situated either in the layer made of a second semiconductor material or at a specific depth below the interface between the layer made of a second semiconductor material and the substrate. Additionally a layer within the region enriched with impurity atoms comprises cavities produced by ion implantation. Furthermore at least one epitaxial layer is applied to the layer made of a second semiconductor material. Also a defect region comprising dislocations and stacking faults lies within the layer comprising cavities. The at least one epitaxial layer is largely crack-free, and a residual strain of the at least one epitaxial layer is less than or equal to 1 GPa.

DISCLOSURE

In the context of the present disclosure, cracks are to be understood as a stress-induced cracking of the at least one epitaxial layer, it being possible for such cracking to extend into the substrate.

Cracks of this type can be ascertained by means of optical microscopy, scanning electron microscopy, atomic force microscopy or X-ray topography.

The residual strain of the at least one epitaxial layer is preferably less than or equal to 370 MPa.

The roughness of the at least one epitaxial layer is preferably less than or equal to 7.0 nm RMS, particularly preferably 0.5 to 2.0 nm RMS.

The substrate made of semiconductor material is preferably a wafer made of monocrystalline silicon.

The provision of an SOI wafer as substrate is also preferred.

Moreover, a semiconductor wafer fabricated by means of a bonding method is also preferred as substrate.

However, the substrate may also comprise polycrystalline semiconductor material.

Also, a substrate comprising a silicon layer, a silicon-germanium layer or a germanium layer may be used.

The region enriched with impurity atoms is preferably enriched with impurity atoms of one or more atom types selected from a group of oxygen, nitrogen or carbon.

The layer comprising cavities within the region enriched with impurity atoms is preferably produced by implantation of light gas ions.

The implanted gas ions are preferably hydrogen ions.

The implanted gas ions are preferably noble gas ions of one or more atom types selected from a group of helium ions, neon ions and argon ions.

Furthermore, it is also preferred for the cavities to have been produced by combinations of implantations of noble gas ions of one or more atom types, selected from a group of helium ions, neon ions and argon ions.

By way of example, the cavities may have been produced by an implantation of helium ions and an additional implantation of neon or argon ions. Corresponding gas mixtures may also be used for producing the cavities.

However, the production of said cavities by a combination of an implantation of hydrogen ions and an implantation of noble gas ions of one or more atom types selected from a group of helium ions, neon ions and argon ions is also preferred.

A combination of hydrogen- and helium-implanted cavities will be considered as an example here.

The layer made of a second semiconductor material that is situated on the substrate is preferably a monocrystalline silicon carbide layer, particularly preferably ion-beam-synthesized silicon carbide on a substrate made of monocrystalline silicon.

The relative expansion of the lattice constant of silicon carbide is less than 0.2% in the silicon carbide layer, which corresponds to a residual strain of the silicon carbide layer of less than 1 GPa.

The residual strain of the at least one epitaxial layer deposited on the silicon carbide layer in such case is less than or equal to 370 MPa.

The disclosure therefore also relates to a semiconductor layer structure, comprising a layer made of ion-beam-synthesized silicon carbide on a substrate made of monocrystalline silicon, and a relative expansion of the lattice constant of silicon carbide in the layer as measured by means of high-resolution X-ray diffraction being less than or equal to 0.2%.

In this case, the lattice constant and the relative expansion thereof are measured, for example, by means of high-resolution X-ray diffraction (HR-XRD). The measured shift, relative to the unstrained value for the lattice constant, produces the specified value for the residual strain of the material by conversion by means of the elastic properties, that is to say by means of the elastic constant of the semiconductor material.

The layer made of a second semiconductor material that is situated on the substrate may also be a layer structure comprising a monocrystalline silicon carbide layer on polycrystalline silicon carbide.

The at least one epitaxial layer on the semiconductor layer structure preferably comprises semiconductor material having a significantly different, namely higher, coefficient of thermal expansion in comparison with the semiconductor material of the substrate.

A first epitaxial layer preferably comprises a nitride compound semiconductor. A second epitaxial layer comprising a nitride compound semiconductor is preferably applied to the semiconductor layer structure. The first epitaxial layer preferably comprises aluminum nitride, and the second epitaxial layer preferably comprises gallium nitride.

Optoelectronic semiconductor components that, after activation, emit light having an energy of 0.1-7.0 eV can be fabricated on semiconductor layer structures of this type.

The layer made of a second semiconductor material situated on the substrate is also preferably an SiGe layer or a layer structure whose topmost layer is an SiGe layer. In this case, the epitaxial layer is preferably an epitaxial silicon layer which is applied on the SiGe layer or layer structure.

The method according to the disclosure and the semiconductor layer structure according to the disclosure will be explained below using particularly preferred embodiments and for the case of a semiconductor layer structure comprising 3C—SiC on silicon.

It has been shown that the method according to the disclosure is particularly well suited to depositing a comparatively thick crack-free layer having a thickness of between 100 nm and 100 μm, for example a thickness of 2.5 μm, which comprises $Al_xGa_{1-x}N$ having a high coefficient of thermal expansion, for example, on an ion-beam-synthesized semiconductor layer structure, such as 3C silicon carbide on silicon, which has a low coefficient of thermal expansion, at high temperatures of approximately 1100° C. which are typical of metal organic chemical vapor deposition (MOCVD).

This is because in the context of the disclosure it has been ascertained that the introduction of a defect structure into an ion-beam-synthesized semiconductor layer structure is advantageous for the later crack- and stress-free deposition of nitride compound semiconductors.

For this purpose, preferably, in a 3C—SiC—Si semiconductor layer structure, by implantation of light gas ions, such as hydrogen, helium, neon or argon (or combinations thereof), a defect-rich region is produced just below, that is to say preferably within a depth interval of 0-500 nm below, the interface between 3C—SiC and silicon, which region comprises gas-filled bubbles or cavities and, if appropriate, additionally a dislocation network and stacking faults between said bubbles or cavities. The abovementioned implantation can likewise only be effected into the 3C—SiC layer which results in a cavity structure accompanied by defects above the interface.

During the later growth of a material having a higher coefficient of thermal expansion at high temperature, i.e., from at least 600° C. up to at most just below the melting point of silicon, this defect structure has the effect that during the cooling operation, the upper part of the silicon substrate can plastically relax thermal stresses by virtue of dislocations and stacking faults being formed between the bubbles or cavities and/or silicon being incorporated into said cavities.

Primarily the formation of dislocations and stacking faults, and also the incorporation of silicon into cavities, would have the effect that a tensile strain of the layer or layers applied to the layer structure, during the cooling operation, would be reduced dynamically and be absorbed by the region of the layer structure near the surface.

A problem that is already known in the prior art is posed by the typical growth rates (typically 1 μm/h) and hence long process times at high temperatures which are present in the MOCVD deposition of III-V semiconductor layers, since cavities fabricated by ion implantation are subject to the phenomenon of Ostwald ripening and the small cavities are coarsened by vacancy diffusion. This leads to a decrease in the density of said cavities over time. The formation of dislocations thus becomes less favorable energetically since the energy of a dislocation rises with its linear expansion, which may have the effect that dislocations are no longer formed and a relaxing effect is no longer present.

It had already been known from Nuclear Instruments and Methods B 175-177 (2001), 132-139, Donnelly et al., that the phenomenon of Ostwald ripening, or the coalescence of smaller bubbles to form larger cavities, can be attenuated, for example by implantation of carbon or oxygen into a region in which a defect region composed of bubbles is subsequently produced, for example, by means of helium implantation followed by a thermal treatment. This would be sought in particular for the purpose of stabilizing the cavities in order to optimize gettering of metallic impurities.

In the context of the disclosure presented here, it has been ascertained that cavities produced by ion implantation in silicon can be stabilized by implantation of oxygen, nitrogen, or carbon ions or combination of implantations of these ion types, even at high temperatures, in particular far beyond the time and temperature range of 900° C. and 30 minutes considered by Donnelly.

In this case, the impurity atoms can be introduced by ion implantation also after the production of the helium bubbles into the desired depth range.

In particular, it is thereby possible to realize higher surface densities of the cavities and thus higher densities of relaxing defect structures, whereby extensive relaxation of the deposited layers can be achieved. Only this enables a deposition of epitaxial layers of semiconductors having a substantially different coefficient of thermal expansion in comparison with silicon.

In particular, by means of a high density of cavities, it is possible to reduce the distances between the latter to an extent such that defect structures comprising dislocations and stacking faults become energetically so favorable that these can be formed between said cavities at low temperatures up to approximately 600° C. Dynamic relaxation of an epitaxial layer on the semiconductor layer structure is consequently possible.

If no cavities were present, or if the density of cavities were low, the distance between two cavities would also be large and, consequently, dislocations and stacking faults would be energetically unfavorable since the energy of such defects is dependent on their expansion. Therefore, production of a high density of stable cavities is desirable.

In particular, the cavities must also be thermally stable, i.e., not permitted to coalesce and form a thermal separating layer in a temperature range of 25-1250° C.

Furthermore the cavities must also be mechanically stable in order to permit further component-relevant process steps. It will be understood by the person skilled in the art that the thermal stability of the cavities can be increased or decreased further by a higher or lower oxygen implantation dose, respectively.

In particular, it should be pointed out that typical deposition times and temperatures in the case of MOCVD are higher than corresponding parameters for gettering of impurities.

It has been ascertained in experiments that a post-implantation of the impurity atoms for the purpose of stabilizing the cavities is preferable to a pre-implantation. In comparison with a post-implantation, with otherwise identical parameters, pre-implantation leads to blistering, i.e., the detachment of parts of the layer structure from the substrate. It is therefore possible to achieve higher cavity densities, and hence also higher densities of relaxing defects, by means of a post-implantation of the impurity atoms.

The inventors have furthermore recognized that the stabilizing effect can in this case be attributed, on the one hand, to the formation of strong Si—O or Si—C bonds which first have to be broken for alteration of an expanded cavity. On the other hand, the diffusivity of helium and vacancy complexes is reduced by an impurity atom implantation, which greatly restricts an Ostwald ripening of helium bubbles or cavities.

As a result, the density of cavities remains high even for long periods of time at high temperatures—that is to say for several hours and at temperatures of 1050° C. or higher—and the formation of dislocations for a desired plastic relaxation remains energetically favorable.

Consequently, the combination of the production of an ion-beam-synthesized layer structure with the provision of a high-temperature-stable defect region within the starting substrate produces a desirable substrate for the deposition of semiconductor layers or structures having substantially different coefficients of thermal expansion.

Ion-beam-synthesized semiconductor layer structure can be fabricated by a procedure in which ions are implanted into a specific depth of a substrate, the latter is then treated thermally, as a result of which a buried monocrystalline layer in the substrate and also, above and below the monocrystalline layer, transition regions form and the upper substrate layer and also the transition region lying above the monocrystalline layer are subsequently removed, as a result of which the monocrystalline layer is uncovered.

An implantation of the desired ion type under corresponding conditions results in the production first of small epitaxial crystallites of the intended compound composed of substrate atoms and implanted ions. In a thermal treatment step, said crystallites coalesce and form a contiguous monocrystalline layer.

The fabrication of a buried 3C—SiC layer in silicon by implantation of carbon ions into a silicon substrate shall be described here as an example.

In order that the compound semiconductor layer produced is brought to the surface, in a subsequent step the substrate covering layer and also the transition region lying above the monocrystalline layer are removed. A chemical etching treatment is preferably carried out for this purpose. As an alternative, however, said layer may also be uncovered by means of oxidation and subsequent chemical removal of this oxide formed or by polishing or else by reactive ion etching or plasma etching.

Optionally, the uncovered surface of the monocrystalline layer can subsequently be smoothed by chemical/mechanical means or by a thermal treatment step at high temperatures, typically to a surface roughness of 5 nm RMS or less.

RMS roughness values of 1 nm RMS or less are preferred, particularly preferably 0.5 nm RMS or less.

A further possibility for smoothing the surface is afforded by the use of ion beams, such as cluster ion beams.

In order then to produce a thermally stable defect structure comprising dislocations and stacking faults in this ion-beam-synthesized semiconductor layer structure first carbon, oxygen or nitrogen ions or combinations thereof are implanted into the semiconductor layer structure produced with a dose of at most $5 \times 10^{17}$ cm$^{-2}$.

In this case, the ion energy is preferably chosen such that the maximum of the implantation profile lies just below, that is to say, typically a few tens of nm below the interface between substrate and the ion-beam synthesized layer.

However, the implantation energy may also be chosen such that the implantation maximum lies within the ion-beam-synthesized layer.

Furthermore, the temperature during the implantation is to be chosen such that no amorphization of the semiconductor layer structure occurs, that is to say principally only point defects are produced. In the case of pure silicon, therefore, the temperature is typically chosen to be above 130° C., so that an ion-beam-induced amorphization no longer occurs here.

Moreover, an excessively great out-diffusion of the implanted hydrogen or noble gas is to be restricted by way of the temperature; consequently, the implantation should take place at a temperature of less than or equal to 800° C.

The implantation temperatures are preferably 130-800° C., implantation temperatures of 250-500° C. being particularly to be preferred.

The choice of the implantation temperature can be used to influence whether cavities are formed as early as during the implantation, or not until a later thermal treatment step. In order to obtain narrow cavity distributions with small average cavity diameters, higher implantation temperatures (~400° C.) have proved to be useful.

In a subsequent ion implantation step, the cavities are then formed, preferably by implantation of light gas ions, for example by implantation of hydrogen, helium, neon or argon ion or combinations of ion implantations of said atom types, which may lead to the later formation of compressive stresses in the silicon and the formation of dislocations.

The implantation energy is preferably chosen such that the density maximum of cavities lies within the maximum of the implantation profile of the oxygen, carbon or nitrogen implantation step.

A subsequent thermal treatment step leads, on the one hand, to the formation of larger cavities and at the same time, by means of compound formation between the implanted oxygen, carbon or nitrogen atoms and the substrate, for example, in the case of silicon, to the formation of Si—O, Si—C or Si—N bonds, which makes it considerably more difficult for the cavities formed to experience a thermally activated diffusive size coarsening.

This suppresses the process of Ostwald ripening and thus counteracts the decrease in the density of the cavities.

The result, therefore, is a semiconductor layer structure having a high density of comparatively small cavities of a few nanometers below the interface between ion-beam synthesized layer and original substrate. Furthermore, there is a high density of other defects at this location, which promotes the formation of interstitial defect agglomerates and dislocations.

If a layer or a layer system comprising a semiconductor material having a substantially different coefficient of thermal expansion in comparison with the semiconductor material of the starting substrate (and hence the entire semiconductor layer structure produced) is then deposited on to the semiconductor layer structure at a temperature of at least 600° C., dislocations and stacking faults formed during the cooling of the layer structure in the defect-rich zone between the cavities remain dense and in substantial quantities on account of the stabilization achieved by means of impurity atoms.

The deposited semiconductor layer structure relaxes elastically by means of a plastic deformation in a defined region—namely in the region comprising the cavities, and also defect structures—of the substrate. Consequently, during the cooling operation, the stresses in the layer system that is deposited later are reduced dynamically and a layer deposited on the semiconductor layer structure is prevented from cracking.

This process also reduces the formation of threading dislocations for layer relaxation in the deposited layer or layer structure, since the required number of dislocations for relaxation is greatly reduced.

One possible variation relates to the order of the implantation steps for introducing the cavity-stabilizing impurity atoms and for producing the cavities themselves or for producing the seeds thereof.

Since the cavities are stabilized by compound formation with the impurity atoms only later in a high-temperature treatment step, the order can be chosen arbitrarily here.

In a further alternative embodiment, it is possible to dispense with the separate thermal treatment step after the production of the thermally stable cavity structure if the deposition of a further layer or layer structure is effected at a temperature of at least 600° C. In this case, the production and passivation of the cavities may be effected together with the deposition of the layer or layer structure.

A further variation of the method relates to the provision of the impurity atoms required for the stabilization of the cavities. If the starting substrate itself already comprises impurity atoms of this type, selected from a group of oxygen, carbon, nitrogen or compounds of elements with the substrate material, then an implantation of said elements is preferably dispensed with if said impurity atoms are present in a high number behind the interface between ion-beam synthesized layer and substrate.

In this case, the impurity atoms may either be dissolved in the substrate and/or be present in precipitates of a compound containing said impurity atoms.

Furthermore, the method described permits the fabrication of substrates for the large-area realization, e.g. of III-V semiconductors, since it is independent of the size of the starting substrates and is therefore dependent only on the availability of said substrates. In particular, conventional silicon wafer diameters of 100 mm, 150 mm, 200 mm, 300 mm shall be mentioned here, 450 mm wafers currently being in the development phase.

In the prior art, by contrast, potential substrates are restricted by the synthesis process to diameters of at most 200 mm for sapphire and 100 mm for 6H— or 4H—SiC.

The short process times required are also particularly advantageous since the implantation doses required for the relaxation lie in the region of at most a few $10^{17}$ cm$^{-2}$ and the thermal after-treatment step can either be chosen to be very short (within the seconds range) or—depending on the later processing—can be entirely obviated.

The semiconductor layer structures according to the disclosure are suitable in particular for realizing cost-effective light emitting diodes (LEDs) specifically based on III-V semiconductors such as GaN or InGaN, and for the fabrication of Schottky diodes, radiofrequency and high-power components, such as high electron mobility transistors (HEMTs), which are based primarily on III-V semiconductors such as AlN and GaN, and also SiC.

BRIEF DESCRIPTION OF THE DRAWINGS

The subject matter of the disclosure will be explained in more detail below with reference to examples and with reference to FIGS. 1-4.

Figure 1:
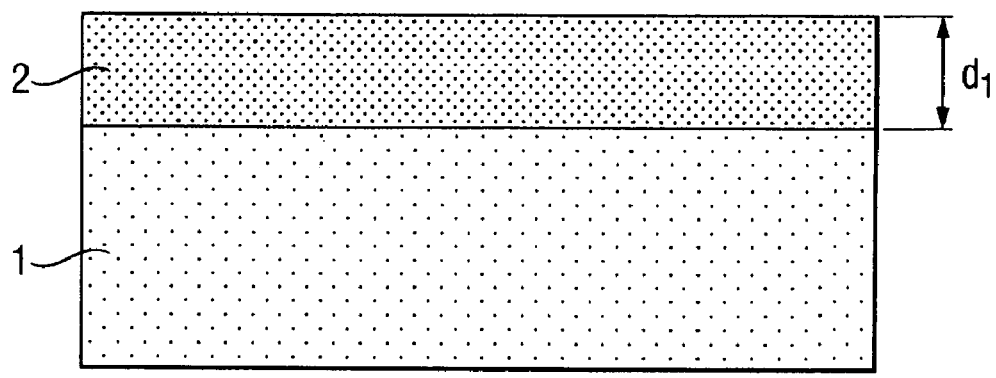
FIG. 1 shows a semiconductor layer structure, comprising a substrate 1 and a layer 2 having the thickness $d_1$.

By way of example the substrate 1 in FIG. 1 is monocrystalline (111)-oriented silicon.

A buried layer 2 having a thickness of approximately 150 nm is produced by means of high-dose carbon ion implantation (energy E=180 keV, dose D=6.75×10$^{17}$ cm$^{-2}$, temperature T=550° C.), which layer was uncovered by a further amorphizing implantation of helium ions (50 keV, D=8.0×10$^{16}$/cm$^2$ at 0° C.) and by means of chemical etching in a solution comprising 1:5 HF:HNO$_3$. This gives rise to an approximately 70 nm thick ion-beam-synthesized 3C—SiC layer 2 lying at the surface of the substrate 1.

Afterward, at a temperature of 400° C., He ions are implanted with an energy of 22 keV and a dose of 2×10$^{16}$/cm$^2$ into the region 3, which until such time does not contain impurity atoms.

Directly afterward this is followed by, likewise at a temperature of 400° C., an implantation of 5×10$^{14}$/cm$^2$ O$^+$ ions at an energy of 85 keV into the region 3, which is situated a few nm to a few tens of nm below the interface between ion-beam-synthesized layer 2 and substrate 1.

This results in the formation, in a defined depth range, of a layer 4 of cavities or seeds for the later growth of cavities, the density maximum of cavities approximately coinciding with the maximum of the oxygen concentration.

First, a 150 nm thick layer 6 made of aluminum nitride (AlN) is then deposited on to this semiconductor layer structure by means of MOCVD at a temperature of 1100° C.

After reduction of the temperature to 1080° C., a 3 μm thick layer 7 made of gallium nitride (GaN) is grown from the precursors tetraethylgallium and ammonia. The growth rate is approximately 1 μm/h so that the entire process lasts approximately 3 h.

Figure 3:
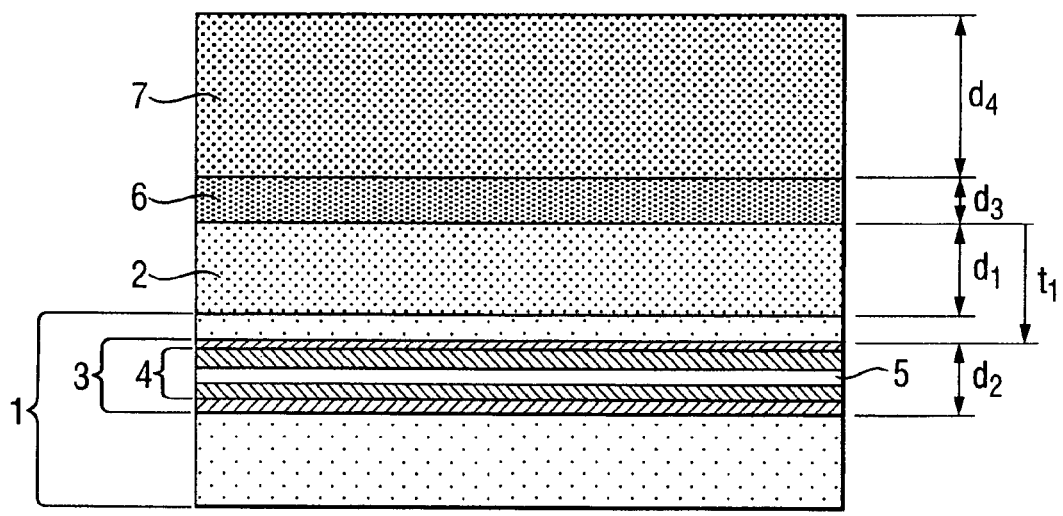
FIG. 3 shows a semiconductor layer structure, comprising a substrate 1, a layer 2 having the thickness $d_1$ at a depth $t_1$ an impurity-atom-implanted layer 3 having the thickness $d_2$, a layer 4 comprising cavities or seeds for cavities, and further layer 6 having the thickness $d_3$ and layer 7 having the thickness $d_4$ having substantially different coefficients of thermal expansion in comparison with the substrate material, which leads to the production of a layer 5 comprising dislocations and stacking faults.

After the layer has cooled, the deposited layer is largely stress-free and, in particular, exhibits no cracks. This results from the formation of a defect structure comprising cavities 4 and dislocations 5 which dynamically reduces the stresses in the layer structure since that defect structure permits a plastic relaxation between substrate 1 and the nitride-containing layers 6 and 7. This occurs without the substrate being broken apart laterally in the region of the cavities produced. The resulting semiconductor layer structure is shown in FIG. 3.

Figure 2:
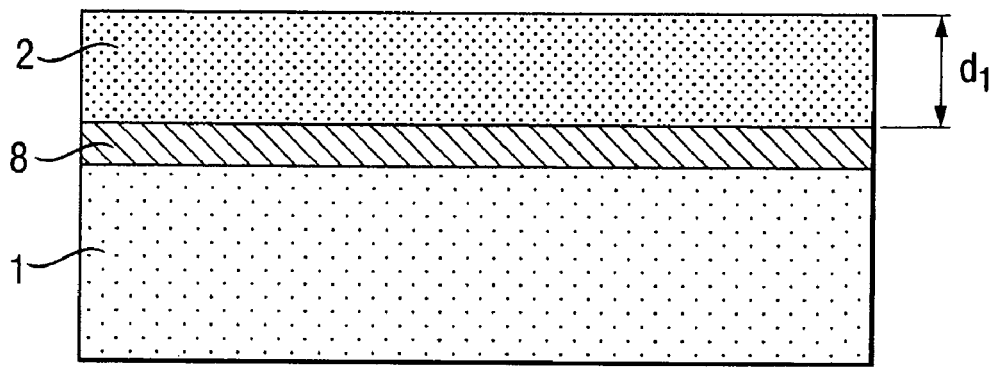
FIG. 2 shows a semiconductor layer structure, comprising a substrate 1, a layer 2 having the thickness $d_1$ and a region 8 having a known impurity atom density or a known impurity-atom-containing precipitate density.

One variation of this method is the use of a semiconductor layer structure with an impurity-atom-containing layer 8, as illustrated in FIG. 2. The oxygen implantation can be obviated in this case. Only cavities are produced by helium implantation, which are then preferably formed at the precipitates. This energetically favorable configuration is likewise largely thermo-stable.

Figure 4:
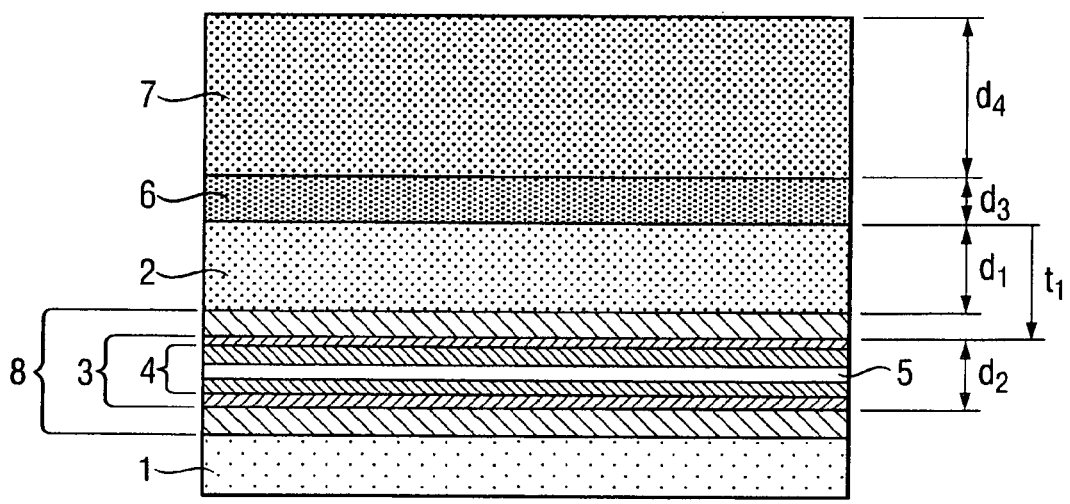
FIG. 4 shows a semiconductor layer structure, comprising a substrate 1, a layer 2 having the thickness $d_1$, a region 8 having a specific impurity atom density or a specific impurity-atom-containing precipitate density, at a depth $t_1$, a layer 3 having the thickness $d_2$ comprising those impurity atoms, a layer 4 comprising cavities or seeds for cavities, and further layer 6 having a thickness $d_3$ and layer 7 having a thickness $d_4$ having substantially different coefficients of thermal expansion in comparison with the substrate material, and a layer 5 comprising dislocations.

Afterward, once again a 150 nm thick layer 6 made of AlN and subsequently a 3 μm thick layer 7 made of GaN is grown by means of MOCVD. Upon cooling, a defect structure comprising cavities and dislocations is then formed again and dynamically absorbs the layer stresses caused by the different coefficients of thermal expansion. The resulting layer structure is illustrated in FIG. 4.

As an alternative to this, in the above example, the immobilization of the cavities can be improved by the surfaces of the cavities being preferably coated with impurity atom bonds—in this case Si—O bonds—in a thermal treatment step prior to the MOCVD deposition. The need for such a process step is dependent on the process duration and temperature of the MOCVD deposition, since these parameters determine the kinetics of the Ostwald ripening of the cavities or gas-filled bubbles. In particular, such a process step is preferable, particularly in the case of long depositions (more than 2 h) at high temperatures (more than 1000° C.). It is primarily possible here to choose the heat treatment conditions such that a sufficient number of stabilizing bonds are formed, but an Ostwald ripening of the cavities largely fails to occur.

A further variation relates e.g. to the use of 3C—SiC layer systems outlined above. In this case, numerous 3C—SiC precipitates are present in the substrate 1 below the ion-beam-synthesized layer 2 in a depth range of typically 0 nm to 200 nm below the interface. This region therefore comprises a silicon matrix with a high density of largely mis-oriented 3C—SiC precipitates.

During the formation of cavities by means of helium implantation and subsequent high-temperature treatment, it appears that the cavities are predominantly attached to said precipitates and are also thermally immobilized thereby. This is caused by, on the one hand, the possible lowering of the total interface energy with respect to the silicon substrate by means of a common interface and, on the other hand the formation of Si—C bonds at the cavity surface. It is understood, however, that the immobilization effect can be further reinforced by a further implantation of oxygen, so that an even greater relaxation can be achieved. The necessity of such an implantation step thus emerges in each case from the degree of relaxation of the deposited layer that is desired for the respective application.

We claim:

1. A method for fabricating a semiconductor layer structure, the method comprising the following steps:
   a) providing a substrate made of a first semiconductor material that includes silicon;
   b) applying a first layer to the substrate, the first layer made of a second semiconductor material that includes silicon carbide, the substrate and the layer defining a semiconductor layer structure, the step of applying the first layer to the substrate including steps of implanting carbon ions into the substrate to produce a buried silicon carbide layer and then removing material to uncover the first layer;
   c) implanting light gas ions into the semiconductor layer structure to produce a cavity layer in the semiconductor layer structure, the cavity layer including a plurality of cavities, wherein the light gas ions are selected from a group consisting of hydrogen ions, noble gas ions, and a combination of hydrogen ions and noble gas ions;
   d) implanting impurity atoms into the semiconductor layer structure with a dose of no more than about 5×10$^{17}$/cm$^2$ to thermally stabilize the cavities, wherein the impurity atoms are of one or more atom types selected from a group consisting of oxygen, nitrogen, and carbon;
   e) applying at least one epitaxial layer to the semiconductor layer structure.

2. The method of claim 1, wherein the substrate is a wafer made of monocrystalline silicon.

3. The method of claim 1, wherein the substrate is an SOI wafer.

4. The method of claim 1, wherein the first layer is a layer structure including a region of high SiC precipitate density and a monocrystalline silicon carbide layer.

5. The method of claim 1, wherein the at least one epitaxial layer includes semiconductor material having a substantially different coefficient of thermal expansion in comparison with the semiconductor material of the substrate.

6. The method of claim 5, wherein the at least one epitaxial layer comprises a nitride compound semiconductor.

7. The method of claim 5, wherein the at least one epitaxial layer is an epitaxial silicon layer.

8. The method as claimed in claim 1, wherein the noble gas ions are selected from the group consisting of helium, neon and argon.

9. The method of claim 1, wherein an energy for implanting the light gas ions is chosen such that the cavity layer is produced below an interface between the first layer and the substrate.

10. The method of claim 1, wherein an energy for implanting the light gas ions is chosen such that the cavity layer is produced within the first layer.

11. The method as claimed in claim 1, further including a step, prior to the step of using impurity atoms, of providing a thermal treatment of the semiconductor layer structure at a temperature of at least 600° C.

12. The method of claim 1, wherein the step of implanting carbon ions and a step of thermal treatment of the semiconductor layer structure produce a buried monocrystalline layer and transition regions above and below the monocrystalline layer and further including a step of removing an upper substrate layer and the transition region above the monocrystalline layer to uncover the first layer.

* * * * *